United States Patent [19]

Yasuda

[11] Patent Number: 5,795,687
[45] Date of Patent: Aug. 18, 1998

[54] PROJECTION EXPOSURE METHOD AND ALIGNMENT

[75] Inventor: Masahiko Yasuda, Kawasaki, Japan

[73] Assignee: Nikon Corporation, Tokyo, Japan

[21] Appl. No.: 606,527

[22] Filed: Feb. 23, 1996

[30] Foreign Application Priority Data

Feb. 24, 1995 [JP] Japan ................... 7-036378

[51] Int. Cl.$^6$ ................................................. G03F 9/00
[52] U.S. Cl. ..................... 430/22; 430/30; 250/491.1
[58] Field of Search ................... 430/22, 30; 250/491.1, 250/548; 356/400, 401

[56] References Cited

U.S. PATENT DOCUMENTS

5,138,176  8/1992  Nishi ........................... 356/401
5,521,036  5/1996  Iwamoto et al. ............... 430/22

*Primary Examiner*—Christopher G. Young
*Attorney, Agent, or Firm*—Oliff & Berridge, PLC

[57] ABSTRACT

A projection exposure apparatus includes different wavelength alignment systems and exposure wavelength alignment systems for positional adjustment for a mask and a substrate. A fiducial plate with incused diffraction grating marks is used on a substrate stage for alignment. Positional discrepancy amounts between marks on the mask and marks on the fiducial plate are previously determined at various measuring points on the fiducial plate. The discrepancy results from difference in drawing error on the fiducial plate. When a mask having different mark positions is used for overlay exposure, the mask and the substrate undergo positional adjustment in accordance with change in positions of the alignment systems by using the previously determined positional discrepancy amounts.

10 Claims, 8 Drawing Sheets

PROJECTION EXPOSURE METHOD AND ALIGNMENT

FIELD OF THE INVENTION

The present invention relates to a projection exposure apparatus. In particular, the present invention relates to a projection exposure apparatus used for production of semiconductor devices (IC), substrates for liquid crystals, thin film magnetic heads and so on.

DESCRIPTION OF THE RELATED ART

Semiconductor devices are advancing to acquire larger capacities and more minute patterns. In accordance with such advancement, projection exposure apparatuses are more strictly requested to achieve higher resolutions year by year. In response to such requests, projection optical systems are being developed to have wider fields and higher resolutions. In order to further fulfill such requests, it is indispensable to develop a highly accurate alignment apparatus.

A so-called die-by-die alignment system has been proposed as one of highly accurate alignment systems, which is a system to perform alignment by successively detecting marks on a reticle and marks on respective shot areas on a photosensitive substrate, such as a wafer on which a photoresist film is applied (hereinafter referred to as "wafer"). As a variant, for example, a so-called different wavelength TTR (Through The Reticle) alignment system has been proposed, which is a system to simultaneously detect reticle marks and wafer marks by additionally using an illumination light beam having a wavelength different from that of a light beam for exposure.

Such a projection exposure apparatus includes at least one exposure wavelength TTR alignment system and at least one different wavelength TTR alignment system. The exposure wavelength TTR alignment system uses an exposure light beam for detecting positions of marks provided at predetermined positions in a field of a projection optical system but outside a circuit pattern area on a reticle. The different wavelength TTR alignment system uses a light beam having a wavelength different from that of the exposure light beam, for detecting positions of marks provided at the periphery of the circuit pattern area on the reticle.

When a fiducial plate fixed on a wafer stage is positioned under the projection optical system, the exposure wavelength TTR alignment system detects positional discrepancy between marks on the reticle and marks on the fiducial plate (corresponding to the marks on the reticle). On the other hand, the different wavelength TTR alignment system detects positional discrepancy between marks on the reticle and marks on the fiducial plate. In such detection, a difference arises between a positional discrepancy amount detected by the exposure wavelength TTR alignment system and a positional discrepancy amount detected by the different wavelength TTR alignment system. The difference corresponds to a positional discrepancy amount resulting from chromatic aberration of a projection lens at the positions of the marks on the reticle detected by the different wavelength TTR alignment system.

Therefore, no alignment error occurs resulting from chromatic aberration at an alignment wavelength (different wavelength), and accurate alignment can be performed by correcting the alignment position on the basis of the detected positional discrepancy amount when a reticle and a wafer are aligned by using the different wavelength TTR alignment system. For example, U.S. Pat. No. 5,138,176 discloses such an exposure apparatus provided with exposure wavelength TTR alignment systems and different wavelength TTR alignment systems as described above for performing alignment by correcting the positional discrepancy amount between a reticle and a wafer resulting from chromatic aberration.

However, the technique described above has had the following problem. Namely, errors due to offset or rotation occur between a reticle and a wafer when errors are present in detected values for positional relation between marks on the reticle and marks on a fiducial plate used for the exposure wavelength TTR alignment systems, the errors resulting from, for example, drawing error of the marks on the fiducial plate or detection error of the exposure wavelength TTR alignment systems. The drawing error means a difference between a design mark pattern and the actual mark pattern which has been formed on the fiducial plate by a photolithographic technique based on the design mark pattern. The detection error of the exposure wavelength TTR alignment systems means a difference between a positional relationship of the marks on the reticle with the marks on the fiducial plate and the positional relationship detected by the exposure wavelength TTR alignment systems. Especially, the offset or the rotation changes depending on the position of the different wavelength TTR alignment systems when the position of the alignment system is changed in response to alteration of the positions of alignment marks on the reticle (change in marking of marks).

SUMMARY OF THE INVENTION

An object of the present invention is to provide a projection exposure apparatus provided with TTR alignment systems, the apparatus being able to correct not only positional discrepancy amounts resulting from chromatic aberration of a projection optical system with respect to a light beam (alignment light beam) having a wavelength different from that of a light beam for exposure, but also positional discrepancy amounts caused by movement of the different wavelength alignment systems in X and Y directions and alignment errors caused by drawing errors or the like of marks on a fiducial plate and marks on a reticle.

According to one aspect of the present invention, there is provided a projection exposure apparatus comprising a reticle stage (RS) which is movable two-dimensionally for holding a reticle including a pattern area (PA), a substrate stage (ST) which is movable two-dimensionally for holding a fiducial plate (FP) and a wafer (W), and a projection optical system (PL) for projecting an image of a pattern in the pattern area (PA) onto the wafer (W) to form the image thereon. First mark areas (Au, Ar, Ad, Al) and third mark areas (RMr, RM1) are formed on the reticle (R). Second mark areas (Fu, Fr, Fd, Fl) corresponding to the first mark areas and fourth mark areas (FMr, FMl) corresponding to the third mark areas are formed on the fiducial plate. The projection exposure apparatus further comprises first mark detecting systems (OBJu, OBJr, OBJd, OBJl, 11–27) and second mark detecting systems (OBl, OBr, 30–38). The first mark detecting systems (OBJu, OBJr, OBJd, OBJl, 11–27) are used for irradiating the second mark areas through the first mark areas and the projection optical system (PL) with a light beam (alignment light beam) having a first wavelength characteristic, and detecting first optical information ($\phi$m) from the first mark areas and the second mark areas. The second mark detecting systems (OBl, OBr, 30–38) are used for irradiating the fourth mark areas through the third mark areas and the projection optical system (PL) with a light beam (exposure light beam) having a second wavelength characteristic different from the light beam having the first wavelength characteristic, and detecting second optical information (ΔXr, ΔYr, ΔXl, ΔYl) produced from the third mark areas and the forth mark areas, in a state in which the first mark detecting systems are able to detect the first optical information (φm). The projection exposure apparatus further comprises an input unit (43), a first arithmetic unit (5), and a second arithmetic unit (5). The input unit (43) is used for inputting positions (Plu, Plr, Pld, Pll) of the first mark areas. The first arithmetic unit (5) is used for computing correction amounts for positional adjustment (ΔFPuf, ΔFPrf, ΔFPdf, ΔFPlf) for the reticle (R) and the wafer (W) on the basis of third optical information (ΔFPu, ΔFPr, ΔFPd, ΔFPl) obtained by detection of a plurality of positions (P1uf to P10uf, P1rf to P10rf, P1df to P10df, P1lf to P10lf) in the second mark areas and the positions of the first mark areas inputted through the input unit (43) by using the first mark detecting systems. The second arithmetic unit (5) is used for computing correction amounts C resulting from chromatic aberration (ΔMx, ΔMy, ΔMθ) caused by the alignment light beam and the exposure light beam relative to the projection optical system on the basis of the first optical information detected by the first mark detecting systems and the second optical information detected by the second mark detecting systems.

According to another aspect of the present invention, there is provided a projection exposure method comprising the steps of inputting positions (Plu, Plr, Pld, Pll) of first mark areas (Au, Ar, Ad, Al) formed on a reticle (R), computing correction amounts for positional adjustment (ΔFPuf, ΔFPrf, ΔFPdf, ΔFPlf) for the reticle (R) and a wafer (W) on the basis of third optical information (ΔFPU, ΔFPr, ΔFPd, ΔFPl) obtained upon detection of a plurality of points (P1uf to P10uf, P1rf to P10rf, P1df to P10df, P1lf to P10lf) in second mark areas (Fu, Fr, Fd, Fl) formed on a fiducial plate (FP) and corresponding to the first mark areas and the positions of the inputted first mark areas, irradiating the first mark areas and the second mark areas through a projection optical system (PL) with a light beam (alignment light beam) having a first wavelength characteristic to detect first optical information (φm) produced from the first mark areas and the-second mark areas, irradiating third mark areas (RMr, RMl) formed on the reticle and fourth mark areas (FMr, Frl) corresponding to the third mark areas with a light beam (exposure light beam) having a second wavelength characteristic different from the light beam having the first wavelength characteristic (alignment light beam) to detect second optical information (ΔXr, ΔYr, ΔXl, ΔYl) produced from the third mark areas and the forth mark areas, in a state of being able to detect the first optical information, and computing correction amounts C resulting from chromatic aberration (ΔMx, ΔMy, ΔMθ) caused by the light beam having the first wavelength characteristic (alignment light beam) and the light beam having the second wavelength characteristic (exposure light beam) relative to the projection optical system on the basis of the first optical information and the second optical information.

The feature of the present invention makes it possible to suppress the change in overlay error even when the different wavelength TTR alignment systems are moved to change the alignment position.

Upon the alignment of the reticle and the wafer by using the different wavelength TTR alignment systems, the offset amount, which results from attachment errors of the fiducial plate, drawing errors of patterns on the fiducial plate or the like, is corrected in addition to the correction for the positional discrepancy amount resulting from chromatic aberration concerning the alignment wavelength as has been hitherto performed in the conventional art. Accordingly, the overlay error of the reticle and the wafer can be suppressed and decreased as compared with the conventional art, and the alignment accuracy is improved.

The change in overlay error can be computed on the basis of the exposure wavelength TTR alignment systems when the different wavelength TTR alignment systems are moved. Accordingly, the alignment accuracy is improved.

The relative positional discrepancy amount between a projected image of a pattern on the reticle and an area to be exposed on the photosensitive substrate occurs even when the detection error corresponding to chromatic aberration concerning the first mark detecting systems is corrected. In the present invention, the relative positional discrepancy amount is inputted, and the correction amount for positional adjustment for the reticle and the wafer is computed on the basis of the inputted positional discrepancy amount. Accordingly, the reticle and the waver can be subjected to accurate positional adjustment even in the case of occurrence of drawing errors or the like of the fiducial plate.

The reticle and the wafer are subjected to positional adjustment by using the optical information obtained through the first mark detecting systems from the optical information obtained from a plurality of points in the second mark areas on the fiducial plate. Accordingly, the reticle and the wafer can be subjected to accurate positional adjustment even in the case of occurrence of attachment errors or the like of the fiducial plate.

DETAILED DESCRIPTION OF THE PREFERRED EMBODIMENT

Next, an overall arrangement of a preferred projection exposure apparatus according to the present invention will be described with reference to FIG. 1.

Figure 1:
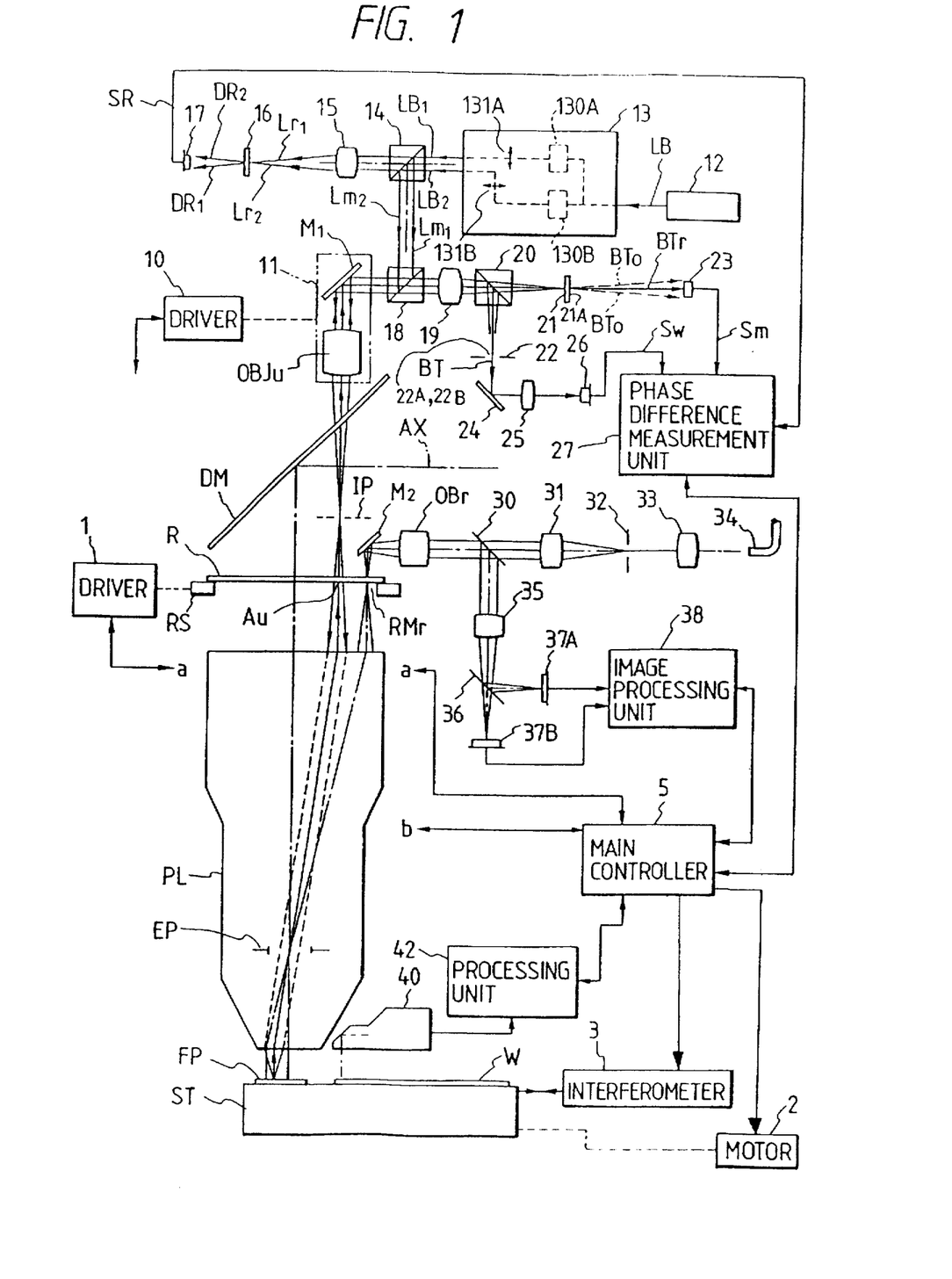
FIG. 1 shows an overall arrangement of a stepper according to an embodiment of the present invention.

In FIG. 1, a light source such as a mercury lamp or a laser (not shown) radiates an exposure light beam such as i-ray (wavelength: 365 nm), excimer laser (wavelength: 248 nm, 193 nm, etc.), and high frequency YAG laser (wavelength: not more than 200 nm). A dichroic mirror DM is provided over a reticle R so that an optical axis of a projection lens PL is bent horizontally. About not less than 90% of the exposure light beam coming along the optical axis AX is reflected by the dichroic mirror DM, and the beam is directed to a pattern area PA on the reticle R. The reticle R is held on a reticle stage RS which is finely movable two-dimensionally (X, Y, θ direction). The reticle stage RS is positioned by a drive unit 1. An XY stage ST for holding a wafer W and a fiducial plate FP is provided under the projection lens PL. The XY stage ST is movable in the X and Y directions by a motor 2. The coordinate position of the stage ST is successively measured by a laser interferometer 3. A main control unit 5 monitors values measured by the interferometer 3, and it controls movement and positioning of the stage ST. The main control unit 5 also controls the drive unit 1.

This embodiment includes different wavelength TTR alignment systems as having four eyes (number of objective lenses) arranged over the dichroic mirror DM. However, FIG. 1 only shows a system which has an objective lens OBJu. The telecentric objective lens OBJu and a mirror M1 are held by a holder 11, and they are movable in the X and Y directions by a drive unit 10. The objective lens OBJu is arranged so that it does not interfere with the dichroic mirror DM, and that its optical axis is perpendicular to the reticle R. A laser light source (He—Ne, Ar ion, etc.) 12 radiates a linearly polarized beam LB (illumination light beam for different wavelength alignment), and the light beam LB comes into a shifter unit 13. The unit 13 includes, in its inside, acousto-optic modulators (AOM) 130A, 130B, small lenses 131A, 131B and so on. The acousto-optic modulators 130A, 130B divides the beam LB into two beams, and applies frequency shift to each of the divided two beams. The small lenses 131A, 131B converges each of the frequency-shifted beams.

AOM 130A is driven at a frequency of f1 (for example, 80 MHz), and its first-order diffracted beam LB1 is taken out through the small lens 131A. AOM 130B is driven at a frequency of f2 (for example, 80.03 MHz), and its first-order diffracted beam LB2 is taken out through the small lens 131B. Each of the two beams LB1, LB2 is divided into two beams by a beam splitter 14. Divided beams Lr1, Lr2 having passed through the beam splitter are converted by a collective lens (inverse Fourier transform lens) 15 into parallel luminous fluxes which cross on the back focal plane.

A reference grating 16 is arranged at the back focal plane, and interference fringes are formed thereon at a pitch corresponding to the crossing angle and wavelength of the two beams Lr1, Lr2. The interference fringes move on the reference grating 16 in one direction at a speed corresponding to a frequency difference $\Delta f$ (30 kHz) between the two beams Lr1, Lr2. A transmission type diffraction grating, which has a pitch equal to the pitch of the interference fringes, is provided on the reference grating 16 in parallel to the fringes. Therefore, the reference grating 16 produces an interference light beam DR1 resulting from a zero-order light beam of the beam Lr1 and a first-order light beam of the beam Lr2, and an interference light beam DR2 resulting from a zero-order light beam of the beam Lr2 and a first-order light beam of the beam Lr1. A photoelectric element 17 detects amounts of light of the interference light beams DR1, DR2. An output signal SR from the photoelectric element 17 is an AC signal of 30 kHz. The signal SR serves as a reference signal for phase comparison upon alignment. Details of the beams LB1, LB2, and the nature of each of the beams transmitted from the lens 15 to the photoelectric element 17 are disclosed in U.S. Pat. No. 5,138,176.

Two beams Lm1, Lm2 reflected by the beam splitter 14 are further reflected by a beam splitter 18, and they come into the objective lens OBJu through the mirror M1. The objective lens OBJu converts the two beams Lm1, Lm2 into parallel luminous fluxes which cross on a plane IP in the space. The plane IP is spaced from the reticle R in the direction of the optical axis AX by a distance corresponding to an axial chromatic aberration amount $\Delta L$. Accordingly, the plane IP is conjugate to the wafer W or the fiducial plate FP at the wavelength ($\lambda 2$) of the illumination beam LB for alignment. The two beams Lm1, Lm2 having crossed on the plane IP passes through a mark area Au on the reticle R while being separated from each other thereon. The two beams Lm1, Lm2 form beam waists at a pupil EP of the projection lens PL, and then they cross again on the fiducial plate FP (or the wafer W) in the form of parallel luminous fluxes.

A interference light beam BT is produced in the vertical direction from a mark area Fu on the fiducial plate FP. Explanation will be made with reference to FIG. 4. The interference light beam BT results from interference between a first-order diffracted light beam produced vertically from the mark Fu upon irradiation with the beam Lm1 and a first-order diffracted light beam produced vertically from the mark Fu upon irradiation with the beam Lm2, and it is a parallel luminous flux in the image space. The interference light beam BT converges into a beam waist at a center of the pupil EP of the projection lens PL, passes through a central transparent portion (portion WMu' in FIG. 2) in the mark area on the reticle R in the form of parallel luminous flux, and proceeds reversely along the optical axis AXa of the objective lens OBJu. The interference light beam BT converges into a beam waist again at a center of a front focal plane of the objective lens OBJu, that is a plane conjugate to the pupil EP of the projection lens PL, and returns toward a light receiving system through the mirror M1 and the beam splitter 18 in this order.

Figure 2:
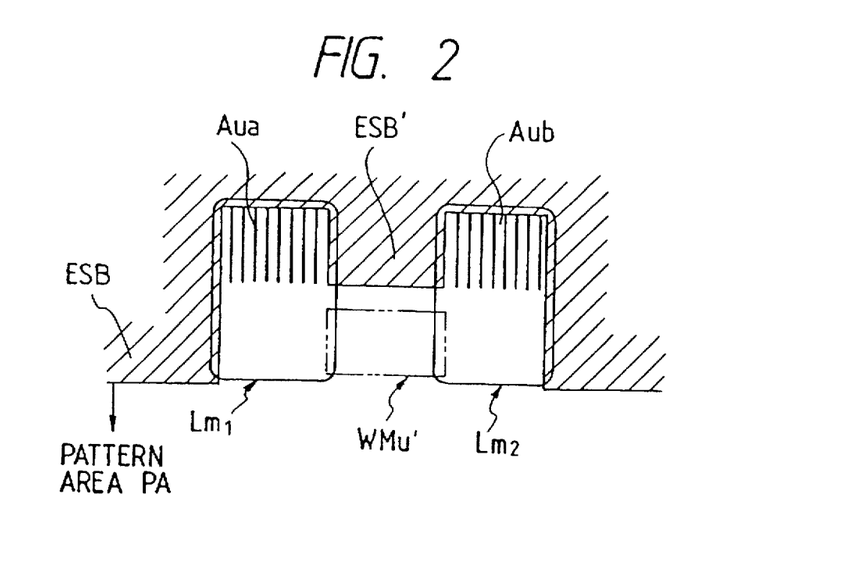
FIG. 2 shows an arrangement of reticle grating marks.
Figure 3:
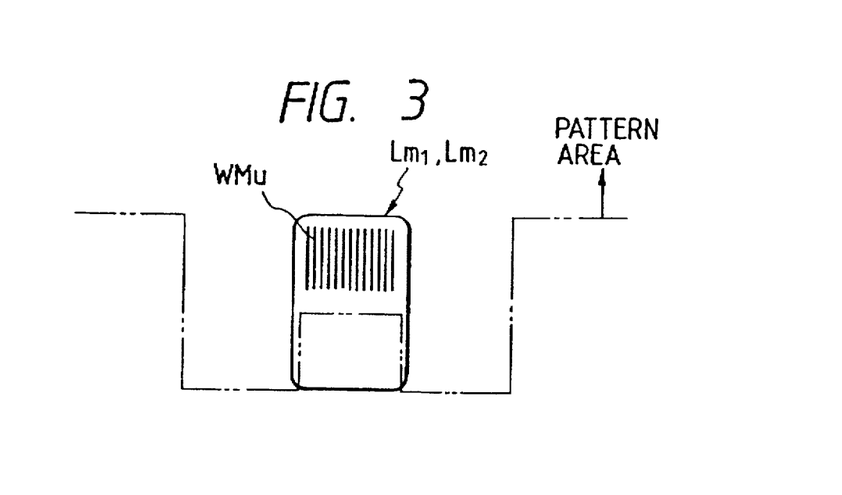
FIG. 3 shows an arrangement of a wafer grating mark.

The structure of the mark area Au on the reticle R will now be explained with reference to FIGS. 2 and 3. FIG. 2 illustrates a mark area on the reticle R, and FIG. 3 illustrates a mark on the wafer W. As shown in FIG. 2, a light shielding band ESB having a constant width is formed on the outer periphery of a circuit pattern area PA on the reticle R. A transparent window is provided in a part of the light shielding band ESB, in which two grating marks Aua, Aub are arranged with a light shielding section ESB' being interposed therebetween. The marks Aua and Aub have the same pitch, each having a width in a direction perpendicular to the pitch direction which is set to be about a half of a width of the transparent window. The light shielding section ESB' has a width which is also set to be about a half of the width of the transparent window. A grating mark WMu on the wafer W corresponds to the portion WMu' in the mark area at the wavelength for alignment. The respective grating marks Aua, Aub are separately illuminated with the two beams Lm1, Lm2 in a rectangular shape. As shown in FIG. 3, the wafer mark WMu is irradiated with the beam Lm1 transmitted through a transparent section of the mark Aua adjacent to the side of the pattern area PA, and the wafer mark WMu is also irradiated with the beam Lm2 transmitted through a transparent section of the mark Aub adjacent to the side of the pattern area PA. The interference light beam BT, which is produced from the mark WMu in the vertical direction, passes through the portion WMu' on the reticle R in FIG. 2, and returns to the objective lens OBJu.

Figure 4:
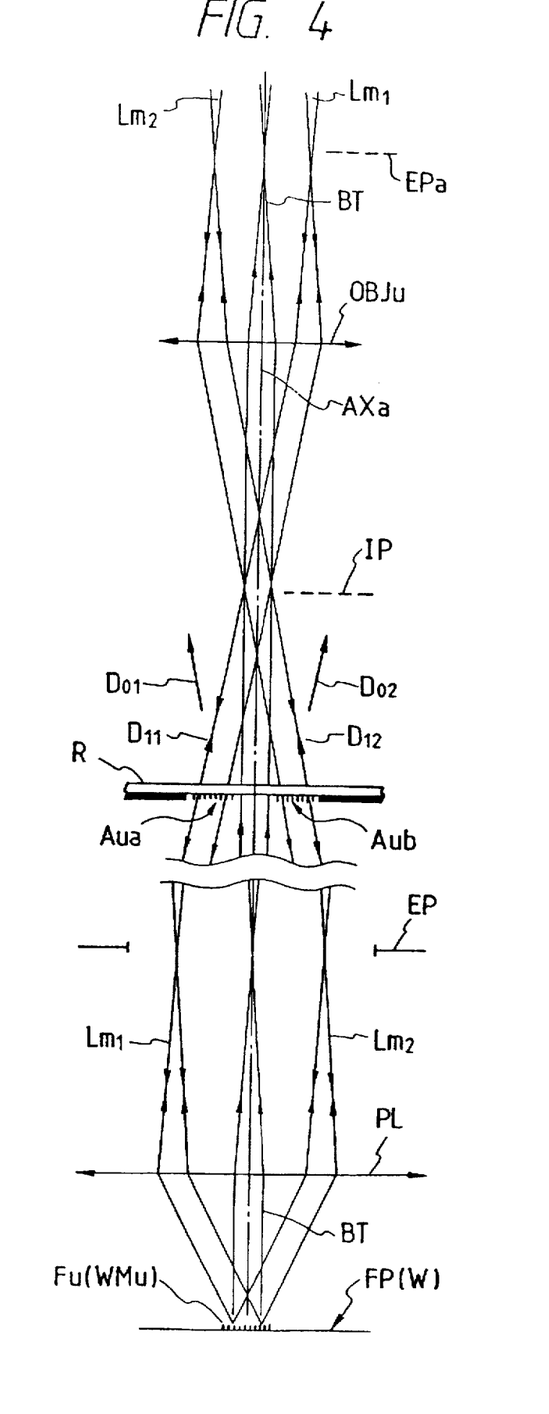
FIG. 4 shows an optical system of a different wavelength TTR alignment system for explanation.

Production of the first-order diffracted light beam from the reticle grating marks Aua, Aub will be explained with reference to FIG. 4. The pitch of the mark Aua (Aub) is set so that the diffraction angle of the first-order diffracted light beam (reflected light beam) with respect to the zero-order light beam D01 (D02) is exactly 2θ' provided that the incident angle of the beam Lm1 (Lm2) upon the grating mark Aua (Aub) is θ' when the reticle grating marks Aua, Aub are irradiated with the beams Lm1, Lm2 respectively in FIG. 4. With such setting, the grating mark Aua produces a first-order diffracted light beam D11 (with a frequency shift of f1) which exactly proceeds reversely along the optical path of the beam Lm1, and the grating mark Aub produces a first-order diffracted light beam D12 (with a frequency shift of f2) which exactly proceeds reversely along the optical path of the beam Lm2. Therefore, the first-order diffracted light beams D11, D12 also return, together with the interference light beam BT, toward the light receiving system through the objective lens OBJu.

Referring to FIG. 1 again, the interference light beam BT and the first-order diffracted light beams D11, D12 pass through the beam splitter 18, and come into a collective lens system 19. The lens system 19 also serves as an inverse Fourier transform lens which converts all of the interference light beam BT and the first-order diffracted light beams D11, D12 into parallel luminous fluxes, and causes them to cross on its focal plane (image conjugate plane). Each of the beams having passed through the lens system 19 is divided into two beams by a beam splitter 20, wherein transmitted one arrives at a fiducial grating plate 21 for the reticle, and reflected one arrives at a field diaphragm 22. Both of the fiducial grating plate 21 and the field diaphragm 22 are conjugate to the plane IP (plane conjugate to the fiducial plate EP or the wafer W). Therefore, the first-order diffracted light beams D11, D12 cross on the fiducial grating plate 21 to form interference fringes in the crossed area. The interference fringes of course move one-dimensionally at the beat frequency $\Delta f$ (30 kHz). A transmission type diffraction grating 21A is provided on the fiducial grating plate 21 covered with a chromium layer. An interference light beam BTr between diffracted light beams coaxially produced from the diffraction grating 21A is received by a photoelectric element 23 (the optical path of each of zero-order light beams BT0 corresponding to the first-order diffracted light beams D11, D12 deviates from the photoelectric element 23). It is noted that the interference light beam BT from the wafer mark WMu can be intercepted only by adjusting the position and size of the diffraction grating 21A on the fiducial grating plate 21 to conform to the size of the mark Aua or Aub. The interference light beam BTr thus received by the photoelectric element 23 varies in intensity in a form of sine wave at the beat frequency $\Delta f$ (30 kHz). Accordingly, the photoelectric element 23 produces an output signal Sm which is an AC signal with its phase difference relative to the reference signal SR changing linearly depending on the amount of displacement of the reticle marks Aua, Aub in the pitch direction on the basis of the reference grating 16.

The interference light beam BT and the first-order diffracted light beams D11, D12 reflected by the beam splitter 20 arrive at the field diaphragm 22. However, the diaphragm 22 is formed with an aperture 22A which allows only the interference light beam BT to pass therethrough. Accordingly, the two first-order diffracted light beams D11, D12 are intercepted by a shielding portion 22B.

The interference light beam BT having passed through the diaphragm 22 arrives at a photoelectric element 26 through a mirror 24 and a collective lens 25. The photoelectric element 26 produces an output signal Sw depending on variation in intensity of the interference light beam BT. This signal Sw also constitutes an AC signal with its level varying in a form of sine wave at the beat frequency $\Delta f$ (30 kHz), the signal Sw having its phase relative to the reference signal SR wherein the phase changes in proportion to the amount of displacement of the mark WMu on the wafer W or the fiducial mark Fu on the fiducial plate FP with respect to the reference grating 16.

Each of the reference signal Sr and the output signals Sm, Sw is inputted into a phase difference measuring unit 27. The measuring unit 27 determines a phase difference $\phi w$ of the output signal Sw relative to the reference signal SR and a phase difference $\phi m$ of the output signal Sm relative to the reference signal SR, and it computes a difference therebetween $\Delta \phi = \phi m - \phi w$. Based on the phase difference $\Delta \phi$, the measuring unit 27 computes positional correction amounts (positional discrepancy amounts) $\Delta X$, $\Delta Y$ of the wafer stage ST or the reticle stage RS, and their values are sent to the main control unit 5. The main control unit 5 controls the drive unit 1 or the motor 2 (or controls the motor 2 through a stage controller 4) on the basis of the detected discrepancy amounts, and it servo-controls the reticle stage RS or the wafer stage ST.

The principle of the positional correction for the wafer and the reticle by using the different wavelength TTR alignment systems as described above is described in detail in U.S. Pat. No. 5,138,176. This document is incorporated herein by reference.

Referring to FIG. 1, a mark RMr on the reticle R is detected by an exposure wavelength TTR alignment system comprising a mirror M2, an objective lens OBr, a beam splitter 30, a lens system 31, an illumination field diaphragm 32 conjugate to the reticle R, a condenser lens 33, a fiber 34, a lens 35 for image formation, a beam splitter 36, and CCD image pickup elements 37A, 37B. An illumination light beam having the exposure wavelength radiated from the fiber 34 comes into the objective lens OBr through the condenser lens 33, and it is bent vertically by the mirror M2 to radiate a local area including the mark RMr on the reticle R. The CCD image pickup elements 37A, 37B have their light receiving planes which are conjugate to the reticle R owing to the objective lens OBr and the lens 35 for image formation. The light receiving planes are also conjugate to the wafer W or the fiducial plate FP through the projection lens PL. The mirror M2 is fixedly arranged so that it is positioned outside the maximum dimension of the pattern area PA assumed on the reticle R. The CCD elements 37A and 37B independently perform positional measurement in the X direction and positional measurement in the Y direction for the cross-shaped mark Rmr, respectively. Image signals (video signals) from the respective CCD elements 37A, 37B are inputted into an image processing unit 38 to detect a positional discrepancy amount between a fiducial mark FMr on the fiducial plate FP and the mark RMr on the reticle R. Information on the positional discrepancy amount is sent to the main control unit 5.

In addition to the components described above, the apparatus includes a global mark detecting system 40 of the off-axis type and a processing unit 42 therefor. The global mark detecting system 40 is used for detecting global alignment marks on the wafer W, latent images in resist layers, and respective fiducial marks on the fiducial plate FP. The apparatus further includes an input unit 43 such as a keyboard or a bar code reader for inputting information on mark positions on the reticle R (mark positions for the different wavelength TTR alignment) into the main control unit 5. The main control unit 5 controls the drive unit 10 on the basis of positional information from the input unit 43 so that reticle alignment marks Au, Ar, Ad, Al are included in fields of objective lenses OBJu, OBJr, OBJd, OBJl of the different wavelength TTR alignment systems.

Figure 5:
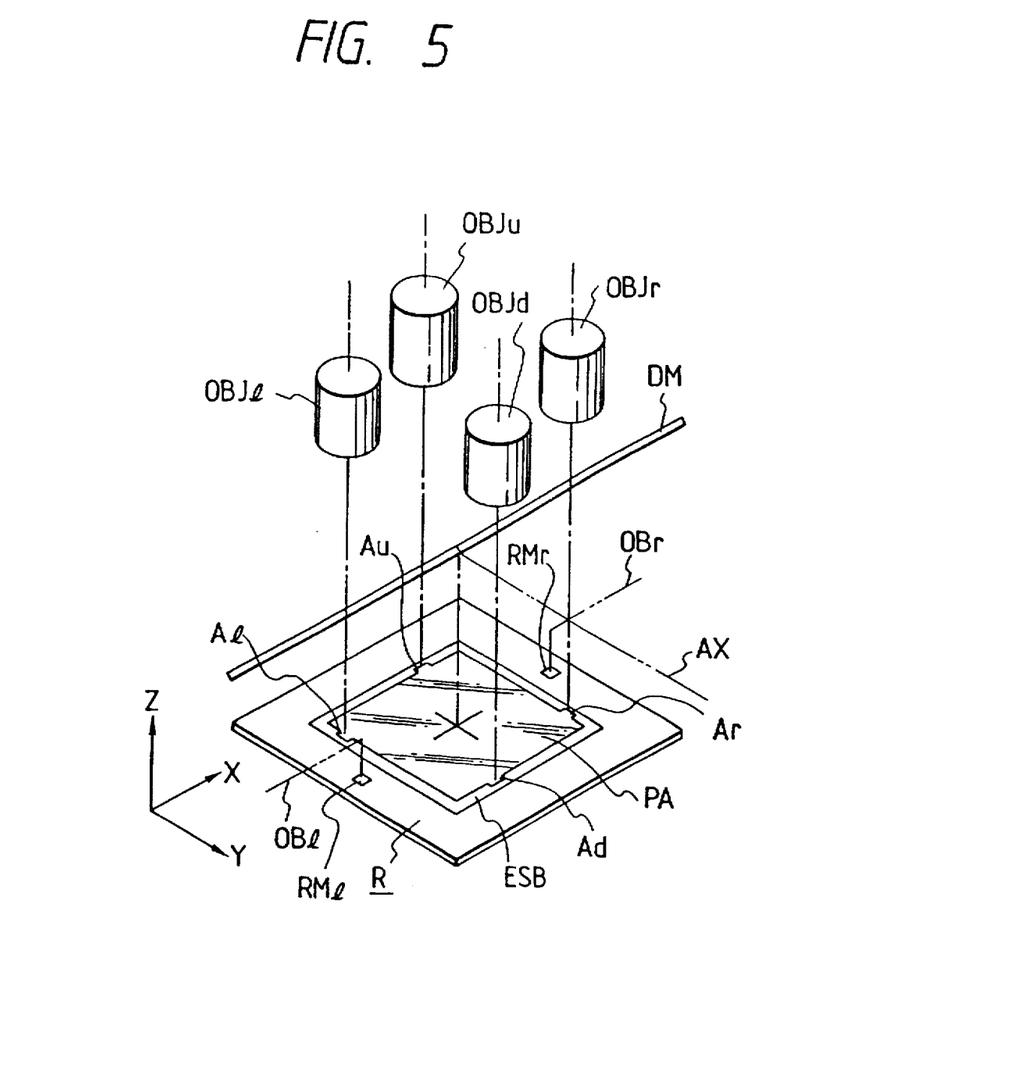
FIG. 5 shows an arrangement of different wavelength TTR alignment systems and exposure wavelength TTR alignment systems.
Figure 6:
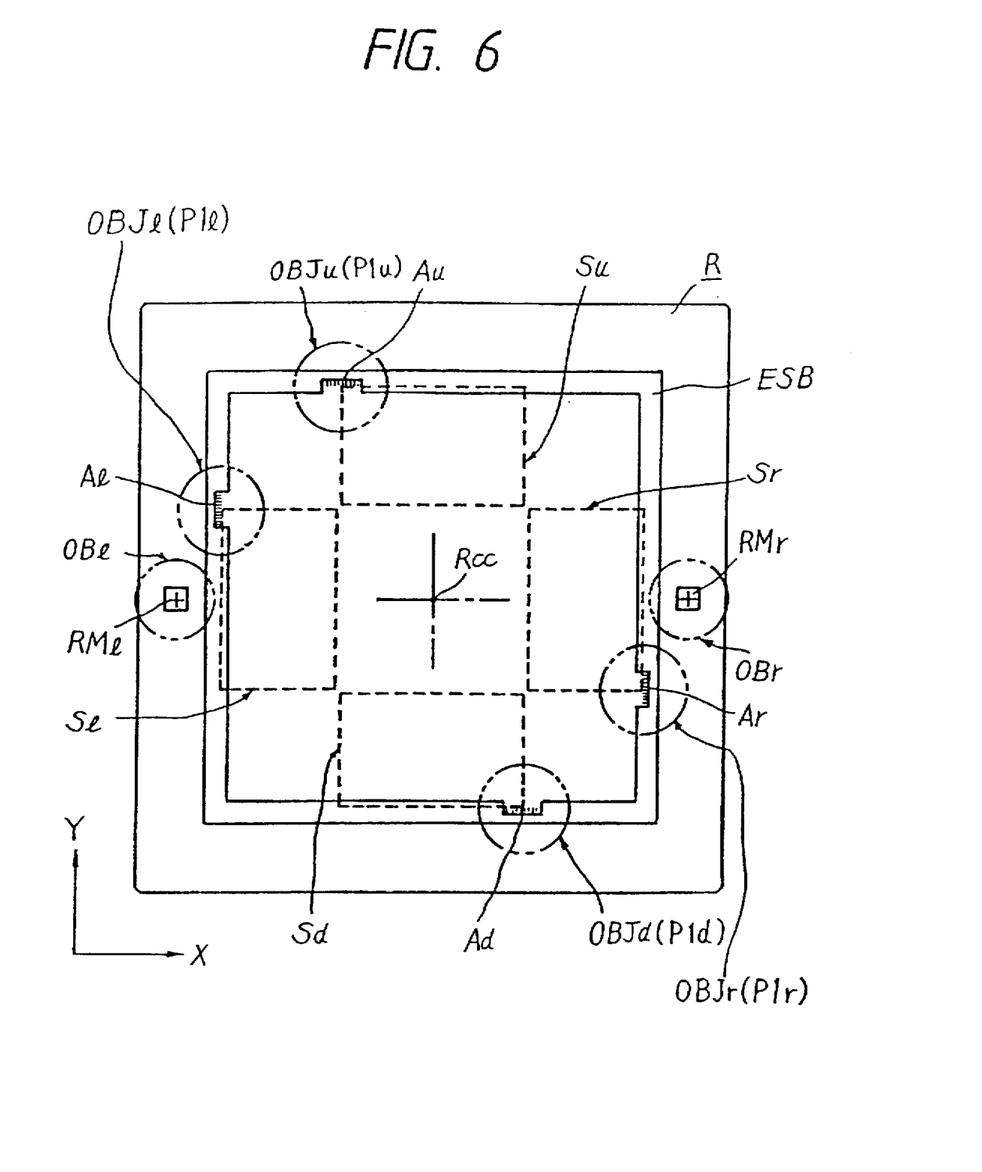
FIG. 6 shows an arrangement of reticle patterns.

The different wavelength TTR alignment systems and the exposure wavelength TTR alignment systems are preferably arranged as schematically shown in FIG. 5. The reticle R shown in FIG. 5 contains the pattern area PA with its periphery used as the light shielding band ESB having respective sides on which reticle grating marks areas Au, Ar, Ad, Al are formed as shown in FIG. 5. As shown in FIG. 6, the mark areas Au, Ad are used for alignment in the X direction, and the mark areas Ar, Al are used for alignment in the Y direction. Similar reticle marks RMr, RMl are further provided at symmetrical positions outside the light shielding band ESB. Therefore, two objective lenses OBr, OBl of the exposure wavelength TTR alignment systems are arranged so that they detect the marks RMr, RMl under the dichroic mirror DM, and four objective lenses OBJu, OBJd, OBJr, OBJl of the different wavelength TTR alignment systems are arranged so that they detect the mark areas Au, Ar, Ad, Al through the dichroic mirror DM respectively.

Next, the mark arrangement on the reticle R shown in FIG. 5 and the mark arrangement on the fiducial plate FP preferably used in this embodiment will be described with reference to FIGS. 6 and 7.

FIG. 6 shows one preferred example of a pattern layout on the reticle R. The reticle R contains the two cross-shaped reticle marks RMr, RMl provided on a line segment which is parallel to the X axis and passes through the center Rcc of the pattern area PA of the reticle R. In the reticle R shown in FIG. 6, the four mark areas Au, Ar, Ad, Al are formed at positions farthest from the reticle center Rcc. Rectangular areas Su, Sr, Sd, Sl indicated by broken lines in FIG. 6 illustrate one example of movable ranges of optical axes (detection center) of the objective lenses OBJu, OBJr, OBJd, OBJl of the different wavelength TTR alignment systems respectively. The mark areas Au, Ad, Ar, Al are respectively provided at the outermost positions within the movable ranges of the objective lenses.

Figure 7:
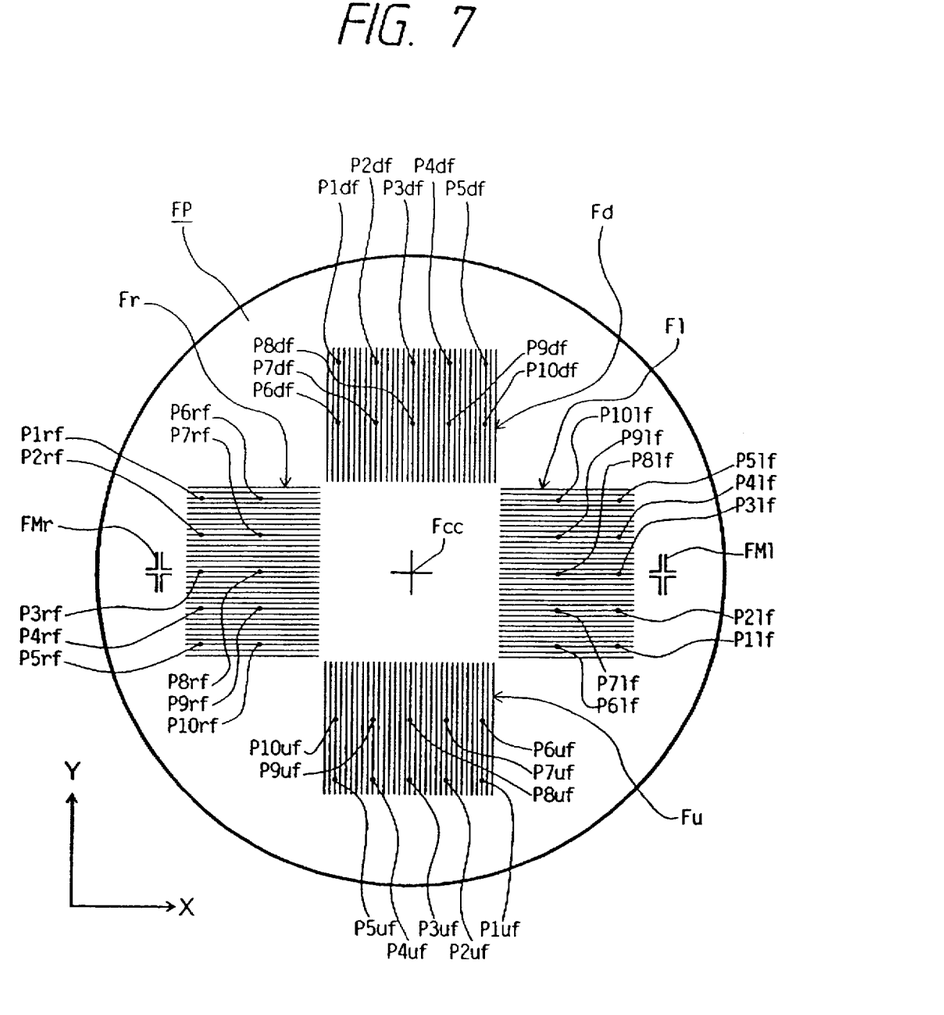
FIG. 7 shows an arrangement of patterns on a fiducial mark plate.

FIG. 7 shows arrangement of respective marks on the fiducial plate FP. Double cross-shaped fiducial marks EMr, FMl are provided on the fiducial plate FP on its right and left sides in the X direction corresponding to the two cross-shaped reticle marks RMr, RM1. Fiducial mark areas Fu, Fr, Fd, Fl incused with diffraction gratings are provided on the fiducial plate FP corresponding to the mark areas Au, Ar, Ad, Al on the reticle R.

The distance between the centers of the two marks FMr, FMl is set to be equal to a value obtained by multiplying the distance between the centers of the marks RMr, RM1 on the reticle by a projection magnification (1/M). Therefore, when the center Fcc of the fiducial plate FP is allowed to coincide with the center Rcc of the reticle, the mark FMr and the reticle mark RMr can be observed by the objective lens OBr of the exposure wavelength TTR alignment system such that the reticle mark RMr is located between the double lines of the mark FMr, and the mark FMl and the reticle mark RM1 can be observed by the objective lens OB1 such that the reticle mark RM1 is located between the double lines of the mark FMl.

The fiducial mark areas Fu, Fr, Fd, Fl are formed so that they have positions and sizes corresponding the respective movable ranges Su, Sr, Sd, S1 on the reticle R when the center Fcc of the fiducial plate FP is allowed to coincide with the center Rcc of the reticle.

In FIG. 6, the positions of the mark areas Au, Ar, Ad, Al (points of reference of the mark areas, such as the center of the respective mark area) are represented by P1$u$, P1$r$, P1$d$, P1$l$ respectively. In FIG. 7, the points on the fiducial plate FP corresponding to the positions P1$u$, P1$r$, P1$d$, P1$l$ are represented by P1uf, P1rf, P1df, P1lf respectively.

For example, the fiducial mark area Fu contains a group of gratings incused with lines formed at a constant pitch in the X direction in the same manner as in the mark WMu on the wafer W. The fiducial mark area Fu is used to detect relative positional discrepancy in the X direction with respect to the mark area Au on the reticle R. Such detection is equally applied to the other fiducial mark areas Fr, Fd, Fl. Therefore, even when the size of the pattern area PA (light shielding band ESB) is changed as a result of exchange of the reticle R, it is possible to detect the discrepancy in the X direction between the mark area Au and the fiducial mark Fu, the discrepancy in the X direction between the mark area Ad and the fiducial mark Fd, the discrepancy in the Y direction between the mark area Ar and the fiducial mark Fr, and the discrepancy in the Y direction between the mark area Al and the fiducial mark Fl provided that the mark areas Au, Ar, Ad, Al on the reticle exists within the movable ranges Su, Sr, Sd, Sl respectively.

Next, alignment of the reticle and the wafer according to this embodiment will be explained.

At first, an arbitrary reticle (for example, see FIG. 6) is set on the reticle stage RS to perform reticle alignment by picking up images of the reticle marks RMr, RM1 and the marks FMr, FM1 on the fiducial plate FP by using the CCD elements 37A, 37B of the exposure wavelength TTR alignment systems.

Next, the objective lenses OBJu, OBJd, OBJr, OBJl (or the holders 11) of the four different wavelength TTR alignment systems are set at positions corresponding to the mark areas Au, Ad, Ar, Al respectively. After that, each of the fiducial marks Fu, Fd, Fr, Fl on the fiducial plate FP is used to check the discrepancy in illumination positions of the two beams Lm1, Lm2, and the telecentric error of the two beams Lm1, Lm2 in each direction. Upon completion of the check, the four different wavelength TTR alignment systems respectively determine relative positional discrepancy amounts between the reticle R and the fiducial plate FP at the positions of completion. In this setting, the positions of the mark areas Au, Ar, Ad, Al on the reticle (detecting positions for the objective lenses OBJu, OBJr, OBJd, OBJl of the different wavelength TTR alignment systems) are P1$u$, P1$r$, P1$d$, P1$l$ respectively as described above (see FIG. 6). Specifically, the measuring units 27 (different wavelength TTR alignment systems) are used to detect the four of the reticle marks Au (fiducial mark Fu), Ad (fiducial mark Fd) and the reticle marks Ar (fiducial mark Fr), Al (fiducial mark Fl). The main control unit 5 stores positional discrepancy amounts ($\Delta$Xr, $\Delta$Yr), ($\Delta$Xl, $\Delta$Yl) detected by the image processing units 38 (exposure wavelength TTR alignment systems) when all phase differences $\Delta\phi$ obtained by the detection by the measuring units 27 are zero. Based on the stored results, the main control unit 5 computes positional discrepancy amounts C ($\Delta$Mx, $\Delta$My, $\Delta$M$\theta$ direction) resulting from chromatic aberration for the reticle R and the fiducial plate FP as follows.

$$\Delta Mx = (\Delta Xr + \Delta Xl)/2$$

$$\Delta My = (\Delta Yr + \Delta Yl)/2$$

$$\Delta M\theta = \Delta Yr - \Delta Yl$$

The positional discrepancy between the reticle R and the fiducial plate FP, which is obtained by using the exposure wavelength TTR alignment systems with the wavelength different from that of the different wavelength TTR alignment systems, is not zero even though a state in which the reticle R and the fiducial plate FP are positioned by the different wavelength TTR alignment systems so that all phase differences $\Delta\phi$ are zero. In such a state, the errors in the X, Y, θ directions (positional discrepancy amounts C) exist corresponding to the chromatic aberration of the projection lens PL at the different wavelength. The errors may be considered as the positional discrepancy amounts C which are constant provided that the positions of the reticle marks Au, Ar, Ad, Al (positions P1$u$, P1$r$, P1$d$, P1$l$) are not changed.

Upon the following practical alignment for shots on the wafer W by using the different wavelength TTR alignment systems, the main control unit 5 controls the reticle stage RS or the wafer stage ST so that a position deviated by the positional discrepancy amounts C is used as a position for achievement of true alignment (or that phase differences from the measuring units are phase differences Δφc corresponding to the position deviated by the positional discrepancy amounts C).

However, even when the positional discrepancy amounts C resulting from the chromatic aberration are corrected, any positional adjustment error O (offset) occurs upon positional adjustment of the pattern on the reticle R and the pattern on the wafer due to drawing errors of the fiducial pattern on the fiducial plate FP, detection errors (offset) of the exposure wavelength TTR alignment systems and so on. Therefore, it is necessary to correct the positional discrepancy caused by the positional adjustment error.

Next, a method for determining the positional discrepancy will be described.

In this embodiment, test exposure is performed to determine the positional discrepancy in accordance with so-called vernier measurement.

At first, the positional discrepancy amounts C described above are used to perform alignment of a wafer formed with main marks for measurement and wafer marks for alignment and a reticle formed with vernier marks for measurement and reticle marks for alignment by means of the different wavelength TTR alignment systems. In this alignment, the reticle and the wafer are positioned so that the vernier marks on the reticle and the main marks on the wafer are in a predetermined relation. After that, the image of the vernier marks is transferred on the wafer by exposure. Next, the global detecting system 40 is used, or the wafer is irradiated with a band-shaped laser spot light beam as disclosed in, for example, U.S. Pat. No. 4,741,622 to detect diffracted light beams from the marks on the wafer. Thus positions of the main and vernier marks are measured by using a sensor (not shown) for measuring mark positions.

For example, cross-shaped marks are used as the main and vernier marks. The positional discrepancy in the X, Y, θ directions is measured by using respective two cross-shaped marks for the main and vernier marks. Offset amounts O for respective axes and respective measurement directions are determined for the different wavelength TTR alignment sensor systems according to results of the measurement. The offset amounts O are stored in a memory of the main control unit 5 as offset amounts obtained when the positions Au, Ar, Ad, Al of the reticle marks are the positions P1$u$, P1$r$, P1$d$, P1$l$. Upon the different wavelength TTR alignment, the main control unit 5 corrects the alignment position by moving the reticle stage RS or the wafer stage ST in amounts corresponding to the offset amounts. Thus it is possible to realize accurate overlay of the pattern on the reticle R and the pattern on the wafer W, and exposure can be performed in a state without any overlay error.

It is sufficient for the measurement of the offset amounts O to be performed once before practical alignment. Accordingly, the throughput does not decrease upon execution of base line measurement (detection of difference between a projection position of a reticle pattern and a detection center of the alignment sensor) or alignment for the reticle R and the wafer W by using the four different wavelength TTR alignment systems.

There may be detection errors of the reticle marks on the reticle R and the fiducial marks on the fiducial plate FP caused by the different wavelength TTR alignment systems. However, such errors are well offset since errors in the same amounts as those produced during the measurement of positional discrepancy amounts resulting from chromatic aberration also occur during the alignment by using the different wavelength TTR alignment systems.

The wafer W is required to undergo exposure for multiple layers. In the case of such exposure, the positions of the reticle marks (Au, Ar, Ad, Al) are occasionally changed. When the positions of reticle marks are changed, it becomes necessary to move the four different wavelength TTR alignment systems in the X and Y directions. When the four different wavelength TTR alignment systems are moved in the X and Y directions to change the alignment position, errors such as positional discrepancy and rotation occur between a projection image of a reticle pattern (the present reticle pattern in which the reticle marks are petitioned at different position from that of the previous reticle) and a shot area on the wafer which was exposed in previous exposure step by using the previous reticle. The amounts of the errors change depending on the alignment position. This is due to the fact that the differences between an actual pattern and a designed pattern on the fiducial plate FP, which results from, for example, drawing errors on the fiducial plate FP, are detected as different amounts depending on the alignment position, and hence offset components change depending on the alignment position.

Thus a method will be explained for correcting the positional error amounts produced when the four different wavelength alignment systems are moved in the X and Y directions (when the reticle mark positions (in other words, alignment mark positions) are different between a reticle for previous exposure and a reticle for present exposure, or when the reticle mark positions are changed).

Specifically, a method will be explained for determining an offset amount upon movement of the objective lens OBJu by using the position P1u of the objective lens OBJu (fiducial mark Fu) as a reference. It is assumed that the offset amount O for the objective lens OBJu at the position P1u has been already determined in accordance with the test exposure described above.

When the objective lens OBJu is at the position P1u, the stage ST is moved in the X direction (measuring direction) in integral multiple of the pitch of the mark Fu (for example, by several pitches to ten and several pitches), and it is moved in the Y direction (non-measuring direction) by an appropriate spacing distance, within a maximum range in which the two beams Lm1, Lm2 outgoing from the objective lens OBJu are not deviated from the mark Fu. Consequently, for example, 10 measuring points (P1uf, P2uf, P3uf, P4uf, P5uf, P6uf, P7uf, P8uf, P9uf, P10uf) are selected on the fiducial plate FP, and the different wavelength TTR alignment system is used to measure positional discrepancy amounts ΔFPu (ΔFPu1 to ΔFPu10) between the mark Au and the mark Fu at the respective measuring points.

In this embodiment, the reticle and the wafer are aligned so that the phase difference from the phase difference measuring unit 27 is zero when the different wavelength TTR alignment system detects the measuring point P1uf, after which the positional discrepancy amounts at each of the other measuring points are determined. In other words, this is equivalent to the fact that the phase difference from the phase difference measuring unit 27 obtained when the different wavelength TTR alignment system detects the measuring point P1uf is used as a reference, and the amounts of variations from this phase difference for the phase differences at the other measuring points are regarded as ΔFP2 to ΔFP10.

During the measurement, the positional relation is not changed between the reticle mark Au and the exposure wavelength TTR alignment system corresponding to the objective lens OBJu. Accordingly, the variation in discrepancy amount ΔFP at each point on the grating (discrepancy amount between the mark Au and the fiducial mark Fu located on each measuring point) results from pattern errors of the fiducial mark Fu, attachment errors (rotation) of the fiducial plate FP to the stage ST, etc. Measurement results at the respective points on the grating are outputted to the main control unit 5 through the phase difference measuring unit 27 (different wavelength TTR alignment system). This measurement enables determination of distribution of the positional discrepancy amounts ΔFPu (10 points) at the 10 measuring points. The distribution of the positional discrepancy amounts ΔFPu is stored in the memory in the main control unit 5.

Next, the attachment error θ (rotation) of the fiducial mark with respect to the stage is measured. At first, the exposure wavelength TTR alignment system corresponding to the objective lens OBr is used to measure a relative position of the fiducial mark FMr with respect to the reticle mark RMr. After that, the stage ST is moved in the X direction by a designed distance between the fiducial marks FMr and FMl so that the fiducial mark FMl is located within the field of the objective lens OBr to measure a relative position of the fiducial mark FMl with respect to the reticle mark RMr. During the two measurements, the positional relation between the reticle mark RMr and the exposure wavelength TTR alignment system corresponding to the objective lens OBr is not changed. Accordingly, the difference in the Y direction between two measured values represents rotational (θs) discrepancy between the fiducial plate marks FMr and FM1 with respect to the stage ST.

Next, the attachment error θs (rotation) of the fiducial plate FP with respect to the stage ST measured by using the exposure wavelength TTR alignment system is XY-converted into values corresponding to each of the grating points, and the values are subtracted from the positional discrepancy amounts (ΔFPu1 to ΔFPu10) measured by using the different wavelength TTR alignment system. Specifically, the positional error at each measuring point based on rotation of the mark Fu (XY-converted value of the attachment error θs (rotation) of the fiducial plate FP at each grating point) is determined on the basis of, for example, the distance from the center of the fiducial plate FP to each of the measuring points PNuf (N=1 to 10) on the mark Fu and the angle formed between the X axis and the fiducial plate FP in FIG. 7. The positional error of each measuring point based on the rotation of the mark Fu is subtracted from the positional discrepancy amount (ΔFPu1 to ΔFPu10), and thus the positional discrepancy amount ΔFPuf based on the fiducial marks FMr, FMl is determined for each of the grating points. The positional discrepancy amount for each of the grating points ΔFPuf (ΔFPuf1 to ΔFPuf10: distribution of ΔFPuf) is stored in the memory in the main control unit 5.

In the same manner as described above, the stage ST is moved in the X direction (measuring direction) in integral multiple of the pitch (for example, by several pitches to ten and several pitches) on the basis of the positions P1rf, P1df, P1lf for the respective marks Fr, Fd, Fl, and it is moved in the Y direction (non-measuring direction) by an appropriate spacing distance.

Consequently, for example, 10 measuring points (P1rf to P10rf, P1df to P10df, P1lf to P10lf) are selected for the respective marks on the fiducial plate FP, and the different wavelength TTR alignment systems are used to measure positional discrepancy amounts ΔFPr (ΔFPr1 to ΔFPr10), ΔFPd (ΔFPd1 to ΔFPd10), ΔFPl (ΔFPl1 to ΔFPl10) between the marks (Ar, Ad, Al) and the fiducial marks (Fr, Fd, Fl) at the respective measuring points.

Namely, the different wavelength TTR alignment systems respectively corresponding to the objective lenses OBJr, OBJd, OBJl are used to measure the discrepancy amounts ΔFP (discrepancy amounts from measured values obtained by the respective sensors when the sensors measure P1rf, P1df, P1lf) between the respective measuring points on the fiducial marks Fr, Fd, Fl and the respective mark areas Ar, Ad, Al (positions P1r, P1d, P1l). Distributions (ΔFPr1 to ΔFPr10, ΔFPd1 to ΔFPd10, ΔFPl1 to ΔFPl10) of pattern errors of the fiducial marks Fr, Fd, Fl and attachment errors (rotation) of the fiducial plate with respect to the stage ST are measured respectively, which are stored in the memory in the main control unit 5. In the same manner as described above, XY-converted values of the attachment errors θs (rotation) of the fiducial plate FP for the respective grating points with respect to the stage ST are subtracted from the distributions of the positional discrepancy measured for the respective objective lenses to determine distributions of the positional discrepancy amounts (ΔFPrf1 to ΔFPrf10, ΔFPdf1 to ΔFPdf10, ΔFPlf1 to ΔFPlf10) which are stored in the memory in the main control unit 5.

It is sufficient for the series of measurements of the θ error to be performed once. Accordingly, the throughput does not decrease upon practical measurement of alignment errors based on the chromatic aberration as described above, or upon execution of alignment of the reticle R and the wafer by using the different wavelength TTR alignment systems.

Figure 8:
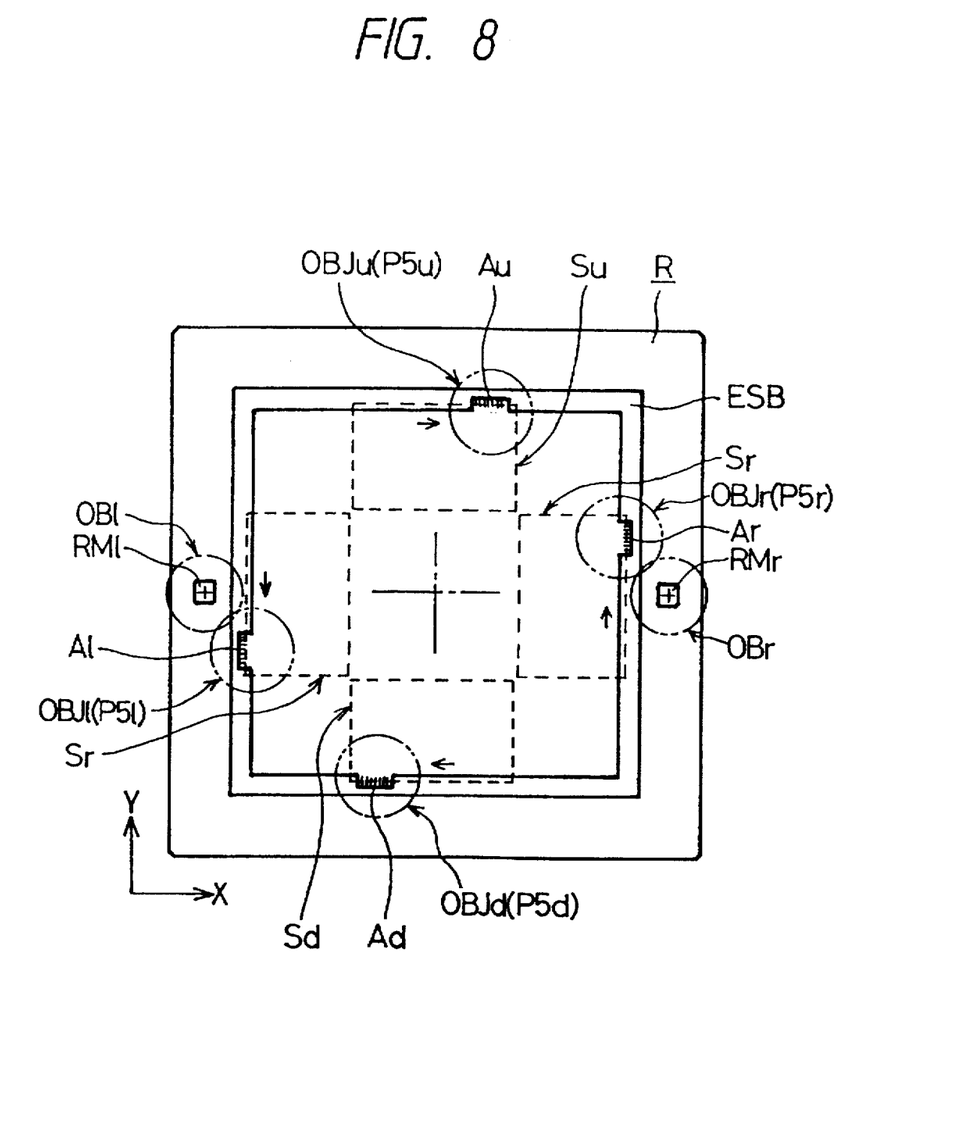
FIG. 8 shows an arrangement of patterns different from the arrangement of the reticle patterns in FIG. 6.

Next, an operation of alignment will be explained when the reticle is exchanged for another reticle having different reticle mark potition. FIG. 8 shows an arrangement of reticle marks (Au, Ar, Ad, Al) different from the reticle marks in FIG. 6. Positions of the reticle marks (Au, Ar, Ad, Al) are represented by P5u, P5r, P5d, P5l. In FIG. 8, the different wavelength TTR alignment systems are moved by the main control unit 5 so that the positions P5u, P5r, P5d, P5l are located within the fields of the objective lenses of the different wavelength TTR alignment systems. Positions on the fiducial plate FP corresponding to the mark positions P5u, P5r, P5d, P5l on the reticle are indicated by P5uf, P5rf, P5df, P5lf as shown in FIG. 7. The respective position P5uf, P5rf, P5df or P5lf corresponds to one of the 10 points of the grating points described above (see FIG. 7).

When the reticle is exchanged for the another reticle shown in FIG. 8, the mark position is changed from the position P1u to the position P5u. It is assumed that the position P1uf has offset amounts of Ox1, Oy1 (offset amounts determined by test exposure), and the position P5uf has a discrepancy amount (discrepancy amount based on the position P1u) of ΔFPufx5. When the reticle mark is changed from the position P1u to the position P5u, the alignment position may be corrected on the basis of the offset amount Ox1+the discrepancy amount ΔFPufx5.

When the mark position is changed from the position P1r to the P5r, from the position P1d to the position P5d, and from the position P1l to the position P5l, the corresponding amounts are determined as follows. Namely, the position P1uf has offset amounts of Ox1, Oy1 (offset amounts determined by test exposure), the positions P1rf, P1df, P1lf also have the same offset amounts, the position P5rf has a discrepancy amount (discrepancy amount based on the position P1r) of ΔFPrfy5, the position P5df has a discrepancy amount (discrepancy amount based on the position P1d) of ΔFPdfx5, and the position P5lf has a discrepancy amount (discrepancy amount based on the position P1l) of ΔFPlfy5. When the reticle mark is moved from the position P1r to the position P5r, the alignment position may be corrected on the basis of the offset amount Oy1+the discrepancy amount ΔFPrfy5 (offset amount Of in Step 107 described below). When the reticle mark is moved from the position P1d to the position P5d, the alignment position may be corrected on the basis of the offset amount Ox1+the discrepancy amount ΔFPdfx5 (offset amount Of in Step 107 described below). When the reticle mark is moved from the position P1l to the position P5l, the alignment position may be corrected on the basis of the offset amount Oy1+the discrepancy amount ΔFPlfy5 (offset amount Of in Step 107 described below).

In the method described above, the four different wavelength TTR alignment systems are used to perform the measurement of the fiducial marks corresponding to each of them. Accordingly, the relative positional relation among the respective fiducial marks Fu, Fr, Fd, Fl is not known accurately. However, the discrepancy in the relative positional relation among the respective four fiducial marks Fu, Fr, Fd, Fl based on the positions of the fiducial marks FMr, FMl corresponding to microscopic positions of the exposure wavelength TTR alignment systems is corrected by correcting the alignment position by using the positional discrepancy amounts ΔFPuf to ΔFPlf described above.

As described above, the correction amounts for the alignment position upon the change in alignment position by moving the four different wavelength TTR alignment systems are determined as values obtained by adding the positional discrepancy amounts C based on the chromatic aberration separately considered at the alignment position after displacement, the positional discrepancy amounts ΔFPuf to ΔFPlf of the respective fiducial marks Fu, Fd, Fr, Fl at the alignment position after displacement, and the offset amounts O at the fiducial position (position P1 in the case of the fiducial mark Fu). The alignment position at each position may be corrected on the basis of the values.

Figure 9:
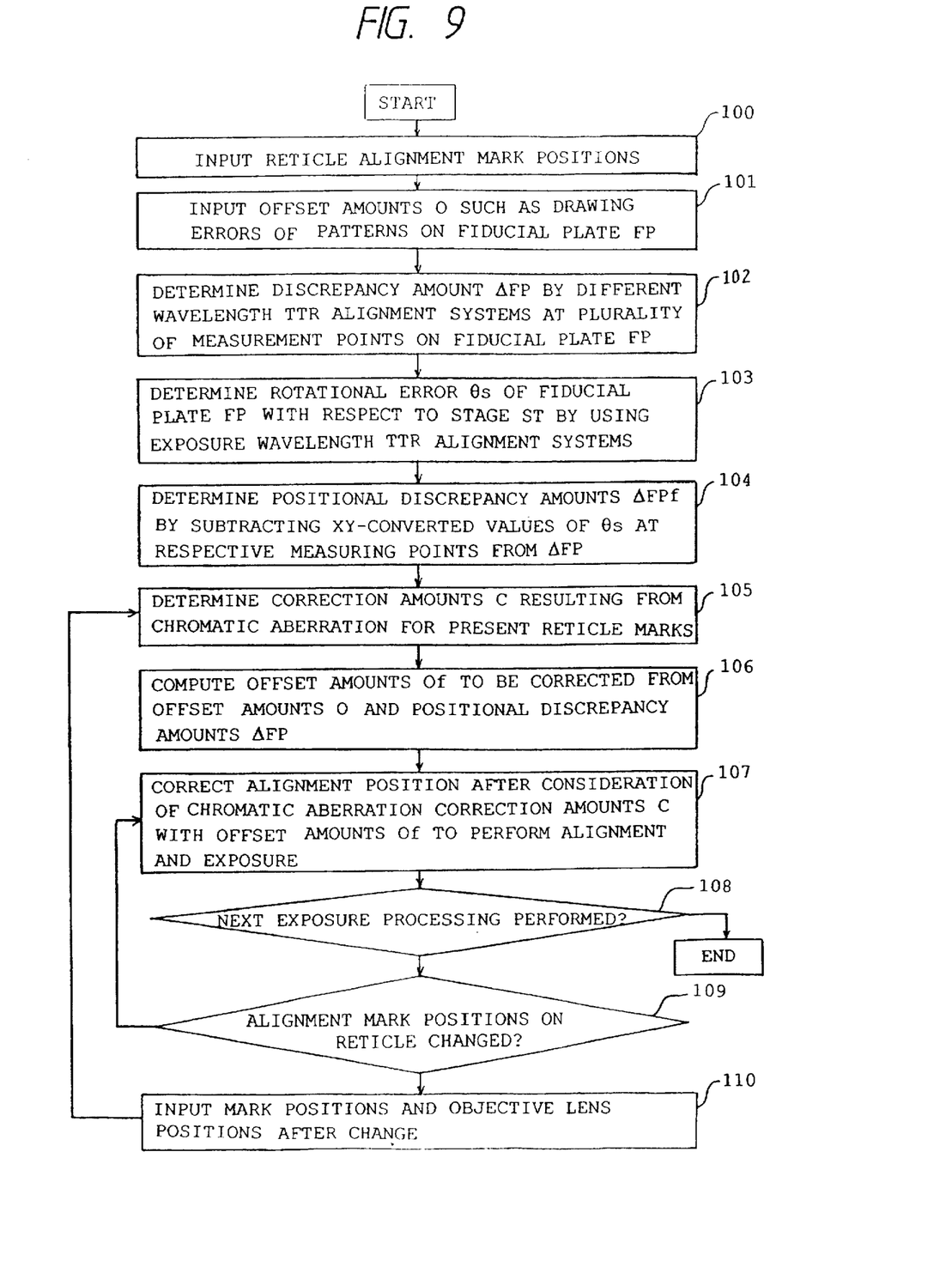
FIG. 9 shows a sequence for executing alignment and exposure by correcting distribution of pattern errors on a fiducial plate for explanation.

Next, the operation for performing different wavelength TTR alignment and exposure by using reticle alignment marks and marks on the fiducial plate FP will be explained with reference to FIG. 9.

[Step 100]

Reticle alignment mark positions (P1u, P1r, P1d, P1l) are inputted through the input unit 43 such as a keyboard or a bar code reader.

[Step 101]

Offset amounts O (offsets amounts determined by test exposure, etc.) at fiducial points (P1u, P1r, P1d, P1l) on the fiducial plate FP are inputted through the input unit 43 such as a keyboard or a bar code reader.

[Step 102]

Distributions of positional discrepancy amounts ΔFP (ΔFPu (ΔFPu1 to ΔFPu10), ΔFPr (ΔFPr1 to ΔFPr10), ΔFPd (ΔFPd1 to ΔFPd10), ΔFPl (ΔFPl1 to ΔFPl10)) determined by the different wavelength TTR alignment systems at respective grating points on the fiducial plate FP (see FIG. 7) are measured.

[Step 103]

Rotational discrepancy θs of marks RMr, RMl with respect to the stage ST (rotational discrepancy of the fiducial plate FP with respect to the stage ST) is measured by using the exposure wavelength TTR alignment systems.

[Step 104]

The main control unit 5 converts θs determined in Step 103 into XY-converted values at positions of the respective measuring points in Step 102. The XY-converted values are subtracted from the discrepancy amounts ΔFP in Step 102 to determine distributions of positional discrepancy amounts ΔFPf (ΔFPuf1 to ΔFPuf10, ΔFPrf1 to ΔFPrf10, ΔFPdf1 to ΔFPdf10, ΔFPlf1 to ΔFPlf10).

[Step 105]

Correction amounts C resulting from chromatic aberration for the present reticle marks are determined.

[Step 106]

Values obtained by adding the positional discrepancy amounts ΔFP to the offset amounts determined in Step 101 are offset amounts Of of the respective marks Fu, Fr, Fd, Fl based on the marks RMr, RMl. The offset amounts Of are stored in the memory in the control unit 5.

[Step 107]

Sensor values (alignment position) after consideration of the positional discrepancy errors C due to chromatic aberration depending on the reticle mark positions are corrected with the offset amounts Of to perform alignment. After that, the pattern area PA undergoes exposure processing with the exposure light beam.

[Step 108]

If alignment and exposure are continued, the routine proceeds to Step 109. If they are not continued, the routine ends the exposure processing for the pattern area PA with the exposure light beam.

[Step 109]

It is judged whether or not alignment is performed after moving the reticle marks (after moving the objective lenses of the different wavelength TTR alignment systems).

In the case of movement, the routine proceeds to Step 110. In the case of no movement, the routine proceeds to Step 107.

[Step 110]

Reticle mark positions, which are different from the reticle mark positions on the reticle in Step 100, are inputted. After that, the routine proceeds to Step 105 to determine correction amounts C resulting from chromatic aberration at the present reticle mark positions.

According to the operation described above, the alignment accuracy is improved.

When the measurement points on the fiducial plate FP are not coincident with detecting positions of the different wavelength TTR alignment systems (reticle alignment mark positions after change), the alignment position may be corrected by using information on any measuring point on the fiducial plate FP nearest to the detecting position of the different wavelength TTR alignment system.

In the embodiment described above, the different wavelength TTR alignment systems have been used to detect errors such as the attachment error and the drawing error of the fiducial plate FP. Other than this method, for example, a measuring instrument may be used to measure the pattern error of marks on the fiducial plate FP one by one. However, such a method is time-consuming, and problems arise in that it is difficult to postulate, from the shape of marks, the detection error of the different wavelength TTR alignment systems and the error-averaging effect depending on the beam area. Accordingly, the measurement by using the actual TTR alignment systems is more effective.

In the embodiment described above, the four eyes of the different wavelength TTR alignment systems have been described. However, the four eyes are not necessarily used at the same time. Exactly the same effect can be obtained even by using only two eyes or three eyes. The invention can be exactly applied equivalently to different wavelength TTR alignment systems of two eyes or three eyes.

According to the present invention described above, the offset such as the attachment error of the fiducial plate and the pattern drawing error on the fiducial plate can be corrected during alignment by the alignment systems which use the light beam having the wavelength different from that of the exposure light beam. Accordingly, the alignment accuracy by the different wavelength alignment systems is improved.

The present invention may be practiced or embodied in other various forms without departing from the spirit or essential characteristics thereof. It will be understood that the scope of the present invention is indicated by the appended claims, and all variations and modifications which come within the equivalent range of the claims are embraced in the scope of the present invention.

What is claimed is:

1. A projection exposure method including positional adjustment for a mask and a photosensitive substrate in relation to a projection optical system by two-dimensionally moving the mask which includes first mark area, third mark area, and a pattern area, or by two-dimensionally moving the photosensitive substrate and a fiducial plate which includes second mark area and fourth mark area corresponding to the first mark area and third mark area, said projection exposure method comprising the steps of:

inputting position of the first mark area;

computing correction amount for positional adjustment for the mask and the photosensitive substrate on the basis of third optical information obtained upon detection of a plurality of positions in the second mark area and the position of the first mark area;

irradiating the first mark area and the second mark area with a light beam having a first wavelength characteristic to detect first optical information produced from the first mark area and the second mark area;

irradiating the third mark area and the fourth mark area with a light beam having a second wavelength characteristic different from the light beam having the first wavelength characteristic to detect second optical information produced from the third mark area and the fourth mark area, in a state of being able to detect the first optical information;

computing a correction amount C resulting from chromatic aberration caused by the light beam having the first wavelength characteristic and the light beam having the second wavelength characteristic relative to the projection optical system on the basis of the first optical information and the second optical information;

performing the positional adjustment for the mask and the photosensitive substrate in relation to a projection optical system by using the correction amount C;

exposing the photosensitive substrate with the mask; and correcting the positional adjustment for the mask and the photosensitive substrate by using the correction amount when a different mask, on which the first mark area is formed in a different position from the mask used in the exposure of the photosensitive substrate, is used for a subsequent exposure of the photosensitive substrate.

2. The projection exposure method according to claim 1, further comprising the steps of inputting an offset amount for the first mark area after inputting the position of the first mark area, and adding the offset amount to the correction amount for positional adjustment for the mask and the photosensitive substrate.

3. The projection exposure method according to claim 1, further comprising the steps of determining a rotational error of a substrate stage and the fiducial plate, and computing the correction amount for positional adjustment on the basis of the third information and the rotational error.

4. The projection exposure method according to claim 1, wherein the second mark area has a plurality of measuring points, and positional discrepancy amounts between the first mark area and the second mark area at the respective measuring points are determined as the correction amount.

5. The projection exposure method according to claim 4, wherein when the different mask is used, the correction of the positional adjustment for the mask and the photosensitive substrate is performed by using the correction amount determined at a measuring point of the second mark area corresponding a position of the first mark area of the different mask.

6. An alignment method for projection exposure including positional adjustment for a mask and a photosensitive substrate in relation to a projection optical system by two-dimensionally moving the mask which includes first mark area and a pattern area, or by two-dimensionally moving the photosensitive substrate and a fiducial plate which includes second mark area corresponding to the first mark area, said projection exposure method comprising the steps of:

detecting the first mark area and a first measuring point in the second mark area which includes the first and second measuring points by using an alignment detection system;

detecting the first mark area and the second measuring point in the second mark area by using the alignment detection system;

determining a first positional discrepancy amount between the first mark area and the first measuring point, and a second positional discrepancy amount between the first mark area and the second measuring point; and memorizing a correction amount in detecting the second measuring position by the alignment detection system based on the first and second positional discrepancy amounts.

7. The alignment method for projection exposure according to claim 6, further comprising inputting an offset amount for the first mark area whenn the first mark area and the second mark area are detected.

8. The alignment method for projection exposure according to claim 6, wherein the first and second measuring points are detected through the projection optical system respectively, and the correction amount includes a rotational error between the mask and the fiducial plate and chromatic aberration of the projection optical system.

9. The alignment method for projection exposure according to claim 6, further comprising performing the positional adjustment for the mask and the photosensitive substrate after detecting the first mark area;

exposing the photosensitive substrate with the pattern area of the mask; and performing the positional adjustment for a different mask having the first mark area formed in a different position from the mask used in the exposure and the photosensitive substrate by using the correction amount determined at a measuring point of the second mark area corresponding the different position of the first mark area of the different mask, when a different mask is used for a subsequent exposure of the photosensitive substrate.

10. The alignment method for projection exposure according to claim 8, further comprising performing positional adjustment for the mask and the photosensitive substrate with respect to the projection optical system based on the memorized correction amount, and exposing the photosensitive substrate with the pattern area of the mask.

* * * * *